(12) United States Patent
Schmalenberg et al.

(10) Patent No.: US 12,360,185 B2
(45) Date of Patent: Jul. 15, 2025

(54) CHIP-SCALE OPTICALLY DETERMINED MAGNETIC RESONANCE SENSOR

(71) Applicant: Toyota Motor Engineering & Manufacturing North America, Inc., Plano, TX (US)

(72) Inventors: Paul Donald Schmalenberg, Ann Arbor, MI (US); Sean P. Rodrigues, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 296 days.

(21) Appl. No.: 18/190,526

(22) Filed: Mar. 27, 2023

(65) Prior Publication Data

US 2024/0329167 A1  Oct. 3, 2024

(51) Int. Cl.
*G01R 33/26* (2006.01)

(52) U.S. Cl.
CPC .................................. *G01R 33/26* (2013.01)

(58) Field of Classification Search
CPC .................................................... G01R 33/26
See application file for complete search history.

(56) References Cited

U.S. PATENT DOCUMENTS

| 9,766,181 | B2 | 9/2017 | Englund et al. |
| 10,677,953 | B2 * | 6/2020 | Stetson ................. G01V 3/101 |
| 10,962,610 | B2 | 3/2021 | Ibrahim et al. |
| 11,946,879 | B2 * | 4/2024 | Hatano ................. G01N 22/00 |
| 2015/0001422 | A1 | 1/2015 | Englund et al. |
| 2019/0235031 | A1 | 8/2019 | Ibrahim et al. |

FOREIGN PATENT DOCUMENTS

| DE | 102017205099 A1 | 8/2018 |
| DE | 102017205265 A1 | 10/2018 |
| DE | 102017205268 A1 | 10/2018 |
| DE | 102018202591 A1 | 8/2019 |

(Continued)

OTHER PUBLICATIONS

Kim et al. "A CMOS-integrated quantum sensor based on nitrogen-vacancy centres", Nature Electronics, vol. 2. 2019.

(Continued)

*Primary Examiner* — Gregory H Curran
(74) *Attorney, Agent, or Firm* — Christopher G. Darrow; Darrow Mustafa PC

(57) ABSTRACT

Embodiments of an integrated apparatus for measuring an external magnetic or other external stimulus are presented herein. This apparatus may include a semiconductor integrated circuit comprising a plurality of metal layers; a solid-state host disposed on the semiconductor integrated circuit and comprising a plurality of color centers; a photonic integrated circuit disposed on the solid-state host and comprising optical modulators and a grating array in optical communication with the plurality of color centers via a material capable of transmitting light below 1000 nm; a microwave antenna formed in a first metal layer in the plurality of metal layers of the semiconductor integrated circuit; and a photodetector in optical communication with the plurality of color centers.

20 Claims, 9 Drawing Sheets

(56) References Cited

FOREIGN PATENT DOCUMENTS

| | | |
|---|---|---|
| IN | 202121010532 | 3/2022 |
| WO | 2019164638 A1 | 8/2019 |
| WO | 2020057890 A1 | 3/2020 |
| WO | 2022183895 A1 | 9/2022 |
| WO | WO-2024113001 A1 * | 6/2024 |

OTHER PUBLICATIONS

Stürner et al. "Integrated and Portable Magnetometer Based on Nitrogen-Vacancy Ensembles in Diamond", Advanced Quantum Technologies, vol. 4, issue 4. 2021.

* cited by examiner

CHIP-SCALE OPTICALLY DETERMINED MAGNETIC RESONANCE SENSOR

TECHNICAL FIELD

The subject matter described herein relates in general to optical detection of magnetic resonances and, more specifically, to a compact ODMR sensor for industrial or consumer applications.

BACKGROUND

Optical detection of magnetic resonances (ODMR) is a technique in which the fluorescence of a crystal defect arising from excitation by an optical signal may be affected by the presence of a magnetic field when the crystal defect is subject to microwave pumping at a resonant frequency. As such, based on evaluating the altered fluorescence, measurements of the strength and direction of the magnetic field may be obtained. A particular crystal defect of interest for ODMR is a nitrogen vacancy (NV) center.

SUMMARY

Embodiments of the present technology include an apparatus for measuring an external magnetic field or other external stimulus. This apparatus includes a semiconductor integrated circuit comprising a plurality of metal layers; a solid-state host disposed on the semiconductor integrated circuit and comprising a plurality of color centers; a photonic integrated circuit disposed on the solid-state host and comprising optical modulators and a grating array in optical communication with the plurality of color centers via a material capable of transmitting light below 1000 nm; a microwave antenna formed in a first metal layer in the plurality of metal layers of the semiconductor integrated circuit; and a photodetector in optical communication with the plurality of color centers.

Embodiments of the present technology include a device for measuring an external magnetic field or other external stimulus. This device includes a semiconductor integrated circuit comprising permanent magnets, a microwave antenna, and photodetectors; a solid-state host disposed on the semiconductor integrated circuit and comprising a plurality of color centers; a photonic integrated circuit disposed on the solid-state host and comprising optical modulators and a grating array in optical communication with the plurality of color centers via a material suitable for transmission of light below 1000 nm; and a laser attached to the photonic integrated circuit to generate an optical signal.

Embodiments of the present technology include an apparatus for measuring an external magnetic field or other external stimulus. This apparatus includes a solid-state host comprising a plurality of color centers; a photonic integrated circuit disposed on the solid-state host and providing an integrated optical path from a laser to the solid-state host via waveguides, optical modulators, and gratings in a material suitable for transmission of light below 1000 nm; and a semiconductor integrated circuit disposed on an opposing side of the solid-state host relative to the photonic integrated circuit and containing a microwave antenna and photodetectors optically coupled to the solid-state host.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
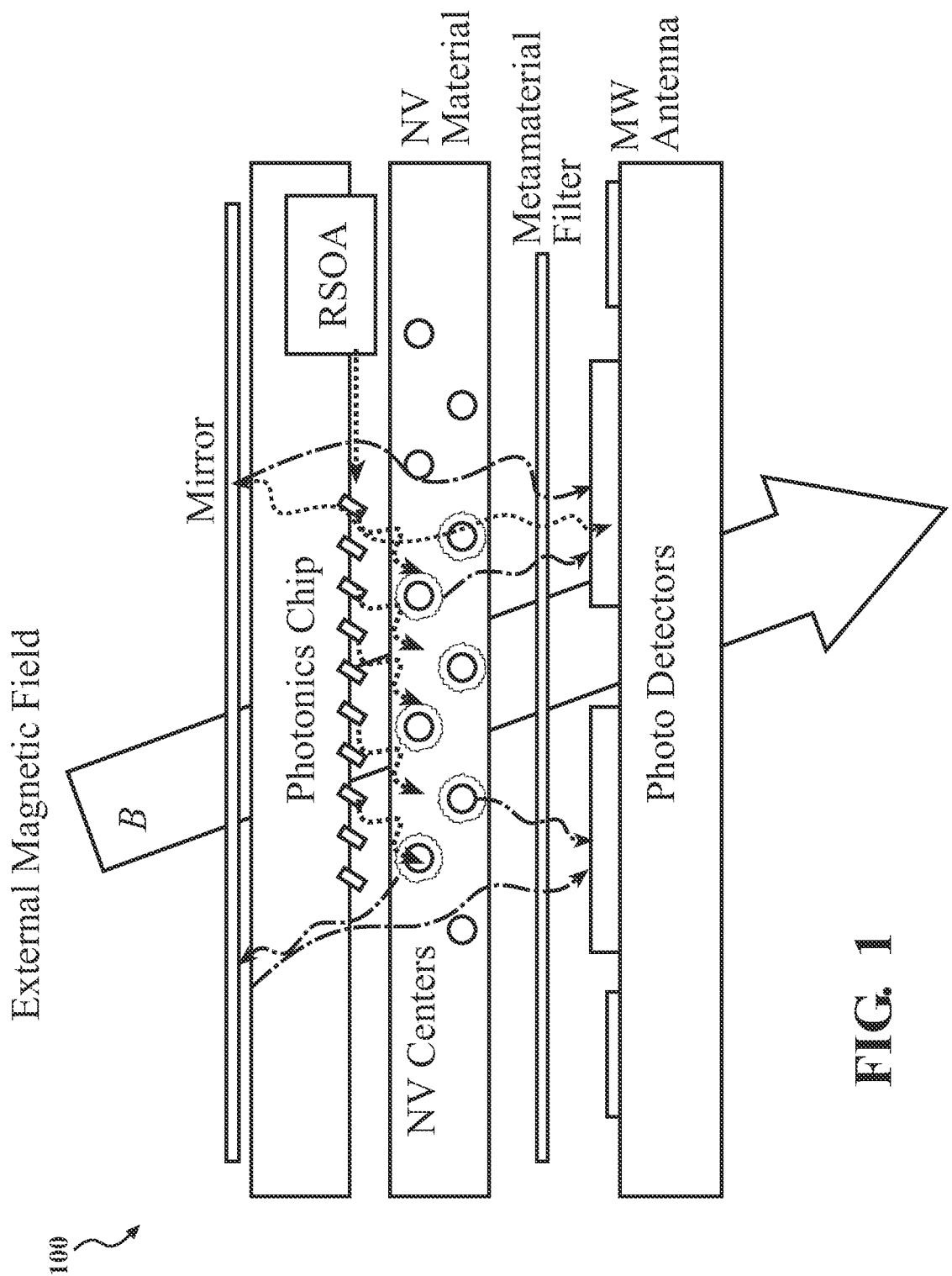
FIG. 1 illustrates an example of an ODMR sensor for industrial or consumer applications.

Systems and methods for an ODMR sensor suitable for industrial or consumer applications are described herein. An illustrative example of an integrated device for ODMR incorporating the systems and methods disclosed herein is presented in FIG. 1. As shown in FIG. 1, a reflective semiconductor optical amplifier (RSOA) laser may emit a green light that is distributed by a photonics chip adjacent to and optically coupled to an NV material containing NV centers. The green light when absorbed by the NV centers (which may also be referred to as color centers) may then cause red fluorescence. A semiconductor integrated circuit adjacent to and optically coupled to the NV material may contain photodetectors to detect the red fluorescence and a microwave antenna for applying microwave signals to the NV centers. Based on microwave pumping from a microwave antenna that may reside in the semiconductor integrated circuit, the frequency components of the red fluorescence may be evaluated to determine the strength and direction of an external magnetic field B. The ODMR sensor may contain an optical filter (e.g., a metamaterial filter) that allows the passage of red fluorescence to the photodetectors while rejecting the green light from the laser. In addition, the ODMR sensor may include a mirror on the top of the photonics chip to reflect green light back to NV centers or red fluorescence to the photodetectors.

Though not shown in FIG. 1, the photonic chip may use materials allowing for the transmission of light below 1000 nm, such as silicon nitride or silicon carbide, as compared to traditional silicon waveguides that are light absorbing below 1100 nm. The photonic chip may also use modulators, such as Mach Zehnder modulators, ring resonator modulators, or other modulators in conjunction with gratings to adjust the location and intensity of the optical signal as applied across the NV material. Another aspect not shown in FIG. 1 is that the semiconductor integrated circuit may include permanent magnets or a microwave generator and phase lock loop.

Figure 2:
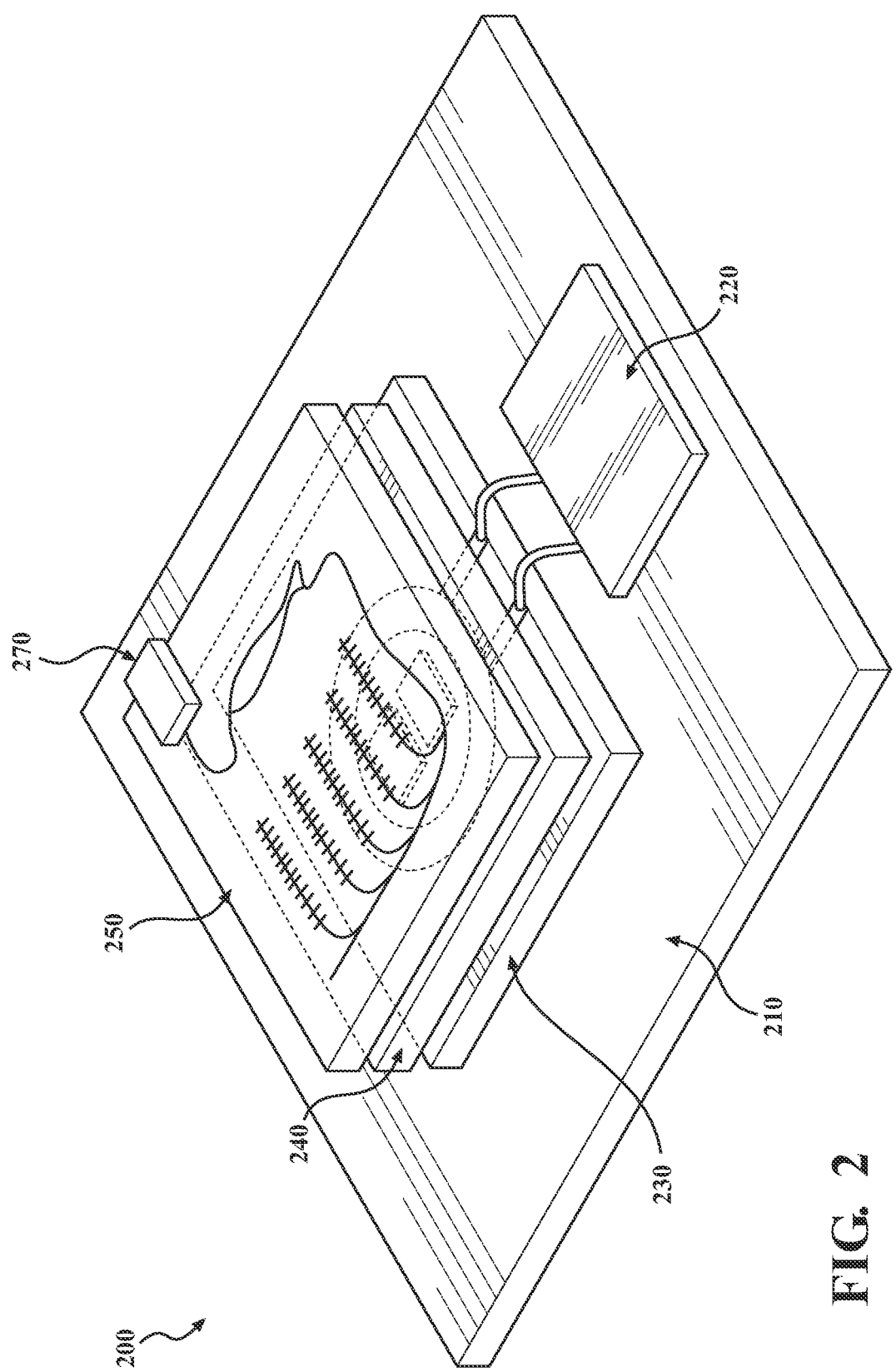
FIG. 2 illustrates an example of an integrated device for ODMR.

With respect to FIG. 2, an example of an integrated device for ODMR is shown. ODMR device 200 may be formed on a carrier PCB 210. ODMR device 200 may be comprised of a first layer (e.g., disposed on carrier PCB 210) in the form of semiconductor integrated circuit 230; a second layer disposed on the first layer in the form of an NV material 240, wherein the second layer is optically coupled to the first layer; and a third layer disposed on the second layer in the form of photonic integrated circuit 250, wherein the third layer is optically coupled to the second layer. ODMR device 200 may also comprise a microwave generator and phase locked loop (Microwave Generator/PLL) 220 electrically coupled to the first layer or integrated therein. ODMR device 100 may also comprise a light source 270 optically coupled to the third layer or integrated therein.

Figure 3:
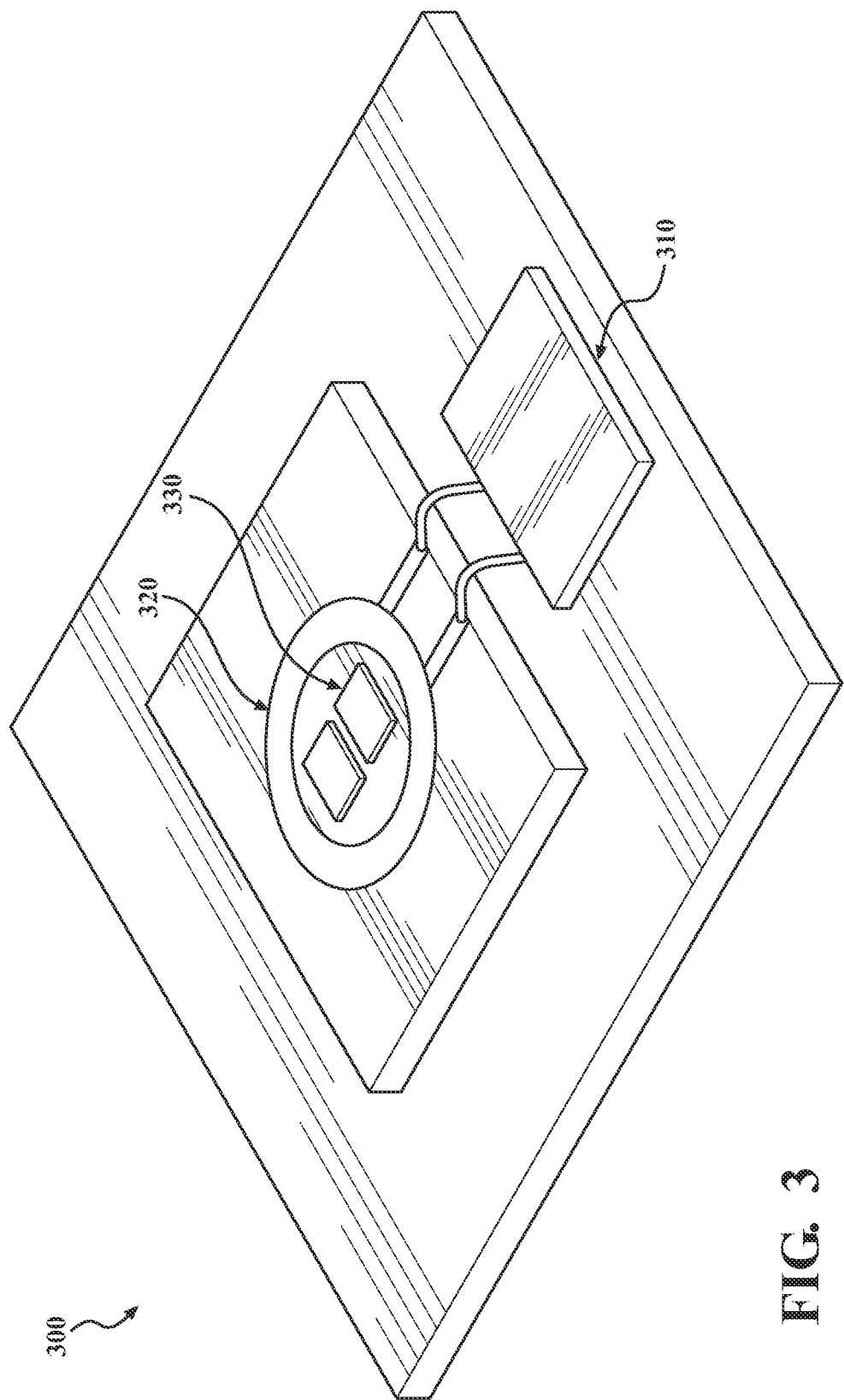
FIG. 3 illustrates an example of a semiconductor integrated circuit as part of an integrated device for ODMR.

Semiconductor integrated circuit 230 may, as shown in FIG. 3, be comprised of a semiconductor integrated circuit 300 with a plurality of metal layers for generating microwave signals and performing photodetection. Semiconductor integrated circuit 300 may comprise a microwave antenna 320 in a first metal layer for transmitting microwave signals to NV Material 240. For example, the microwave antenna may be a coiled loop inductor with a resonance near 2.87 GHz. A microwave generator and phase locked loop (Microwave Generator/PLL 310) may be electrically coupled to microwave antenna 320. In some embodiments, Microwave Generator/PLL 310 may be a device residing on carrier PCB 210 and in electrical communication with microwave antenna 320. In other embodiments, Microwave Generator/PLL 310 may reside in one or more metal layers within semiconductor integrated circuit 300 rather than as a device residing on carrier PCB 210. Microwave Generator/PLL 310 may generate microwave signals near 2.87 GHz.

Semiconductor integrated circuit 300 may also comprise photodetectors 330 for detecting fluorescence from NV material 240. For example, photodetectors may be configured to detect fluorescence between 400 nm to 1100 nm (e.g., as may be provided by silicon photodiodes). In some embodiments, an optical filter may be applied on or within semiconductor integrated circuit 300 to filter out optical signals not resulting from fluorescence of color centers. For example, the optical filter may suppress green light (e.g., at 532 nm) from reaching photodetectors 330, while allowing a range of light (e.g., via a bandpass filter configured to pass 575 nm to 800 nm, via a bandpass filter with a bandwidth of 80 nm centered at 637 nm) resulting from the fluorescence of color centers to reach photodetectors 330. In some embodiments, permanent magnets may be applied on or within semiconductor integrated circuit 300, as described below, to provide a magnetic bias to NV material 240.

Figure 4:
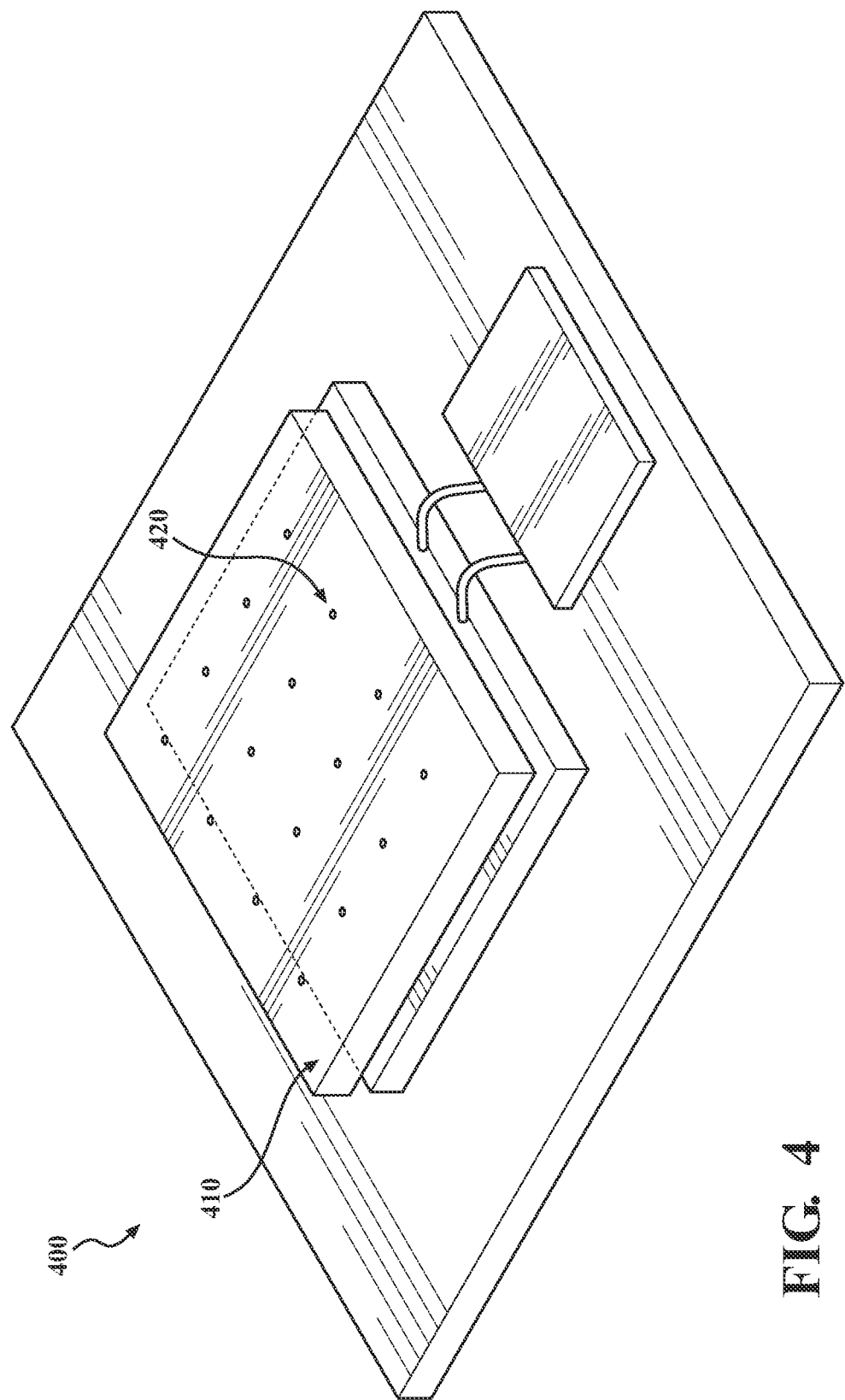
FIG. 4 illustrates an example of a NV material as part of an integrated device for ODMR.

NV material 240 may, as shown in FIG. 4, by comprised of a solid-state host 400 comprising a plurality of color centers. For example, solid state host 400 may take form of NV material 410, comprising a diamond crystal lattice with NV centers 420 in the form of nitrogen vacancy defects distributed therein. For example, the NV material may be formed by use of chemical vapor deposition to form a diamond, which may have a small fraction of single substitutional nitrogen traps vacancies generated as a result of plasma synthesis. In some embodiments, irradiation by high-energy particles and annealing may also be used to enhance the presence of NV centers in a NV material. In some embodiments of NV Material 410, portions of the color center substrate may have an enhanced color center density or have a specific color center orientation.

Figure 5:
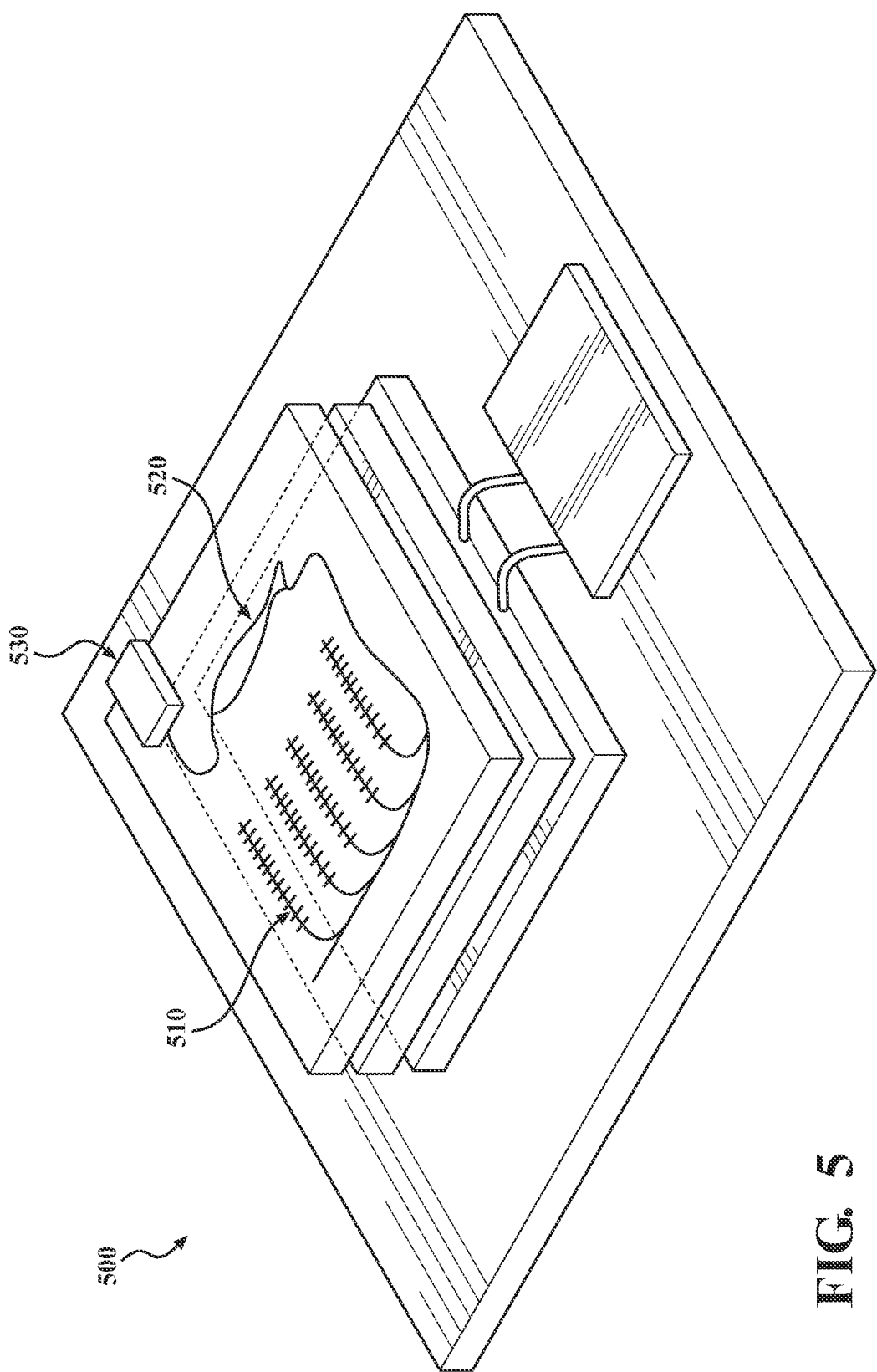
FIG. 5 illustrates an example of a photonic integrated circuit as part of an integrated device for ODMR.

Photonic integrated circuit 500 may, as shown in FIG. 5, be comprised of a photonic transmission, modulation, and distribution layer for providing an integrated optical path between a light source and the NV material 240. For example, photonic integrated circuit 500 may be optically coupled to light source 530, such as via photonic integrated circuit waveguides implemented in material(s) that allow low loss transmission of visible light power. Light source 530 may be a laser generating light at a frequency to excite NV centers into fluorescence (e.g., 532 nm generated by an RSOA). In some embodiments, light source 530 may be comprised of a laser coupled to the photonic integrated circuit 500 via fiber/ball assisted coupling, direct edge coupling, or laser-to-chip integration. Photonic integrated circuit 500 may then convey the optical signal from the laser via a waveguide to optical modulators 520. Light source 530 may also be a laser gain chip implemented via Fabry-Perot system. Material of the gain chip may be composite III-V material such as GaN, InP, InAlGaAs, GaAs, or any other combination which emit small wavelength visible light.

With respect to waveguides or other optical components, traditional silicon waveguides are light absorbing below 1100 nm. Accordingly, photonic integrated circuit 500 may use materials allowing for the transmission of light below 1000 nm, such as silicon nitride or silicon carbide, to transmit an optical signal, such as one at 532 nm, from light source 530 through the optical modulators 520 and gratings 510 to NV Material 240.

Figure 6:
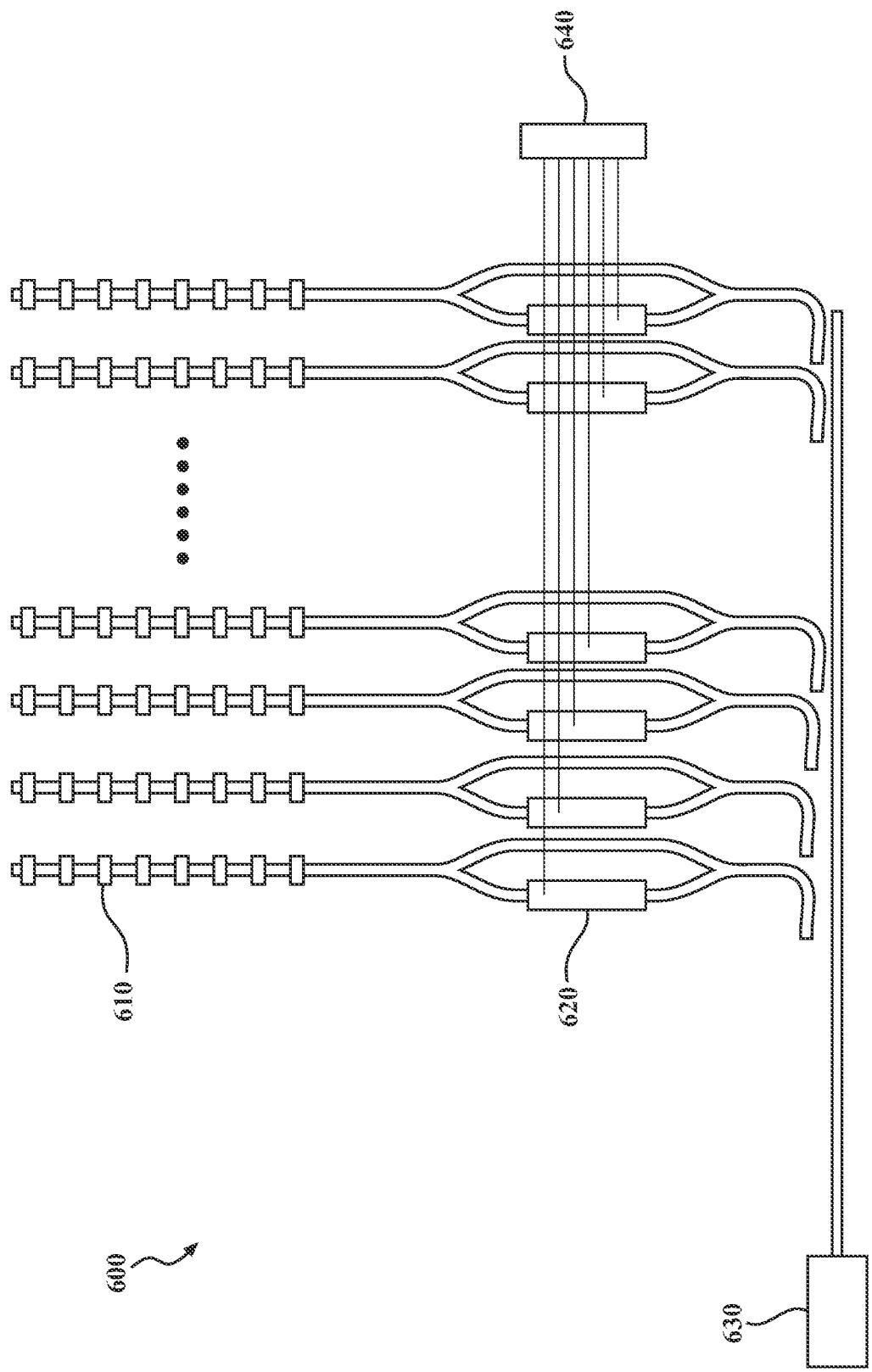
FIG. 6 illustrates an example of a photonic integrated circuit employing Mach Zehnder modulators and gratings.

Optical modulators 520 may be comprised of an optical modular, such as Mach Zehnder modulators or ring resonator modulators. For example, as shown in FIG. 6, laser 630 is optically coupled to Mach Zehnder modulators 620, which are then further optically coupled to gratings 610. In addition, Mach Zehnder modulators 620 may be electronically controlled by electronic control bus 640. In some embodiments, electronic control bus 640 may reside in semiconductor integrated circuit 300 and be electrically coupled to the photonic layer and further therein to Mach Zehnder modulators 620. Based on one or more control signals (e.g., as generated by electronic control bus 640), Mach Zehnder modulators 620 may adjust the output intensity of one or more members of gratings 610. Pitch spacing of such gratings may be configured to allow direct coherent emission into the color center substrate. Gratings may also be configured to be aligned to portions of the color center substrate where color center density has been enhanced or where color center orientation has been carefully controlled. In this manner, photonic integrated circuit 500 may allow for not only applying an optical signal to NV material 240, but also further providing for adjusting the intensity of the optical signal with respect to different locations across NV material 240.

Figure 7:
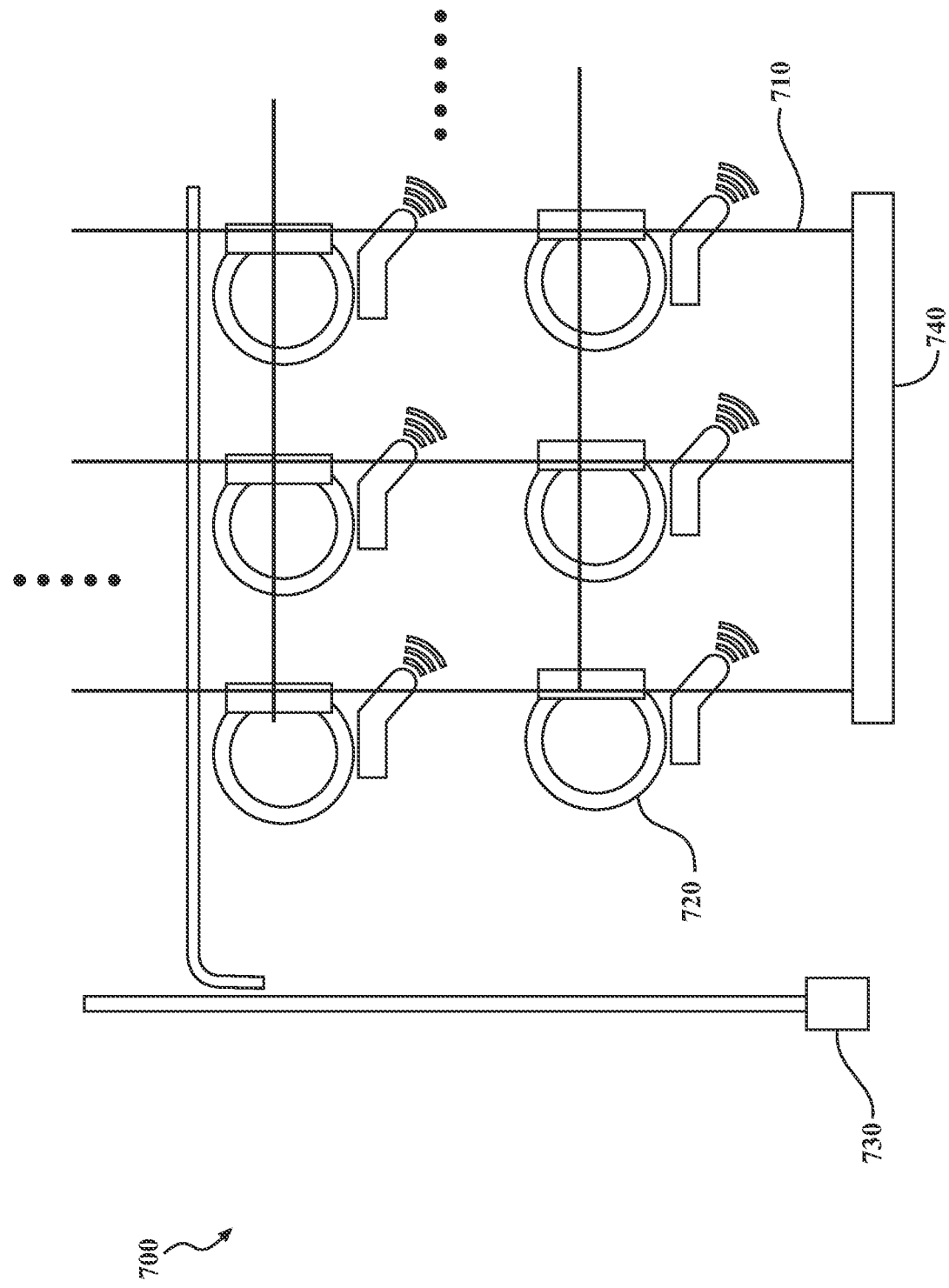
FIG. 7 illustrates an example of a photonic integrated circuit employing ring resonator modulators and gratings.

As another example, as shown in FIG. 7, laser 730 is optically coupled to ring resonator modulators 720, which are then further optically coupled to gratings 710. In addition, ring resonator modulators 720 may be electronically controlled by matrix electronics control bus 740. In some embodiments, matrix electronic control bus 740 may reside in semiconductor integrated circuit 300 and be electrically coupled to the photonic layer and further therein to ring resonator modulators 720. Based on one or more control signals (e.g., as generated by matrix electronics control bus 740), ring resonator modulators 720 may adjust the output intensity of one or more members of gratings 710. In this manner, photonic integrated circuit 500 may allow for not only applying an optical signal to NV material 240, but also further providing for adjusting the intensity of the optical signal with respect to different locations across NV material 240.

In various embodiments, photonic integrated circuit 500 may also use other approaches for optical modulators 520, such as liquid crystal techniques, strain-based techniques, thermal-optical techniques, or electro-optic techniques known in the art. Also, in various embodiments, photonic integrated circuit 500 may use with respect to gratings 510 any gratings known in the art.

Figure 8:
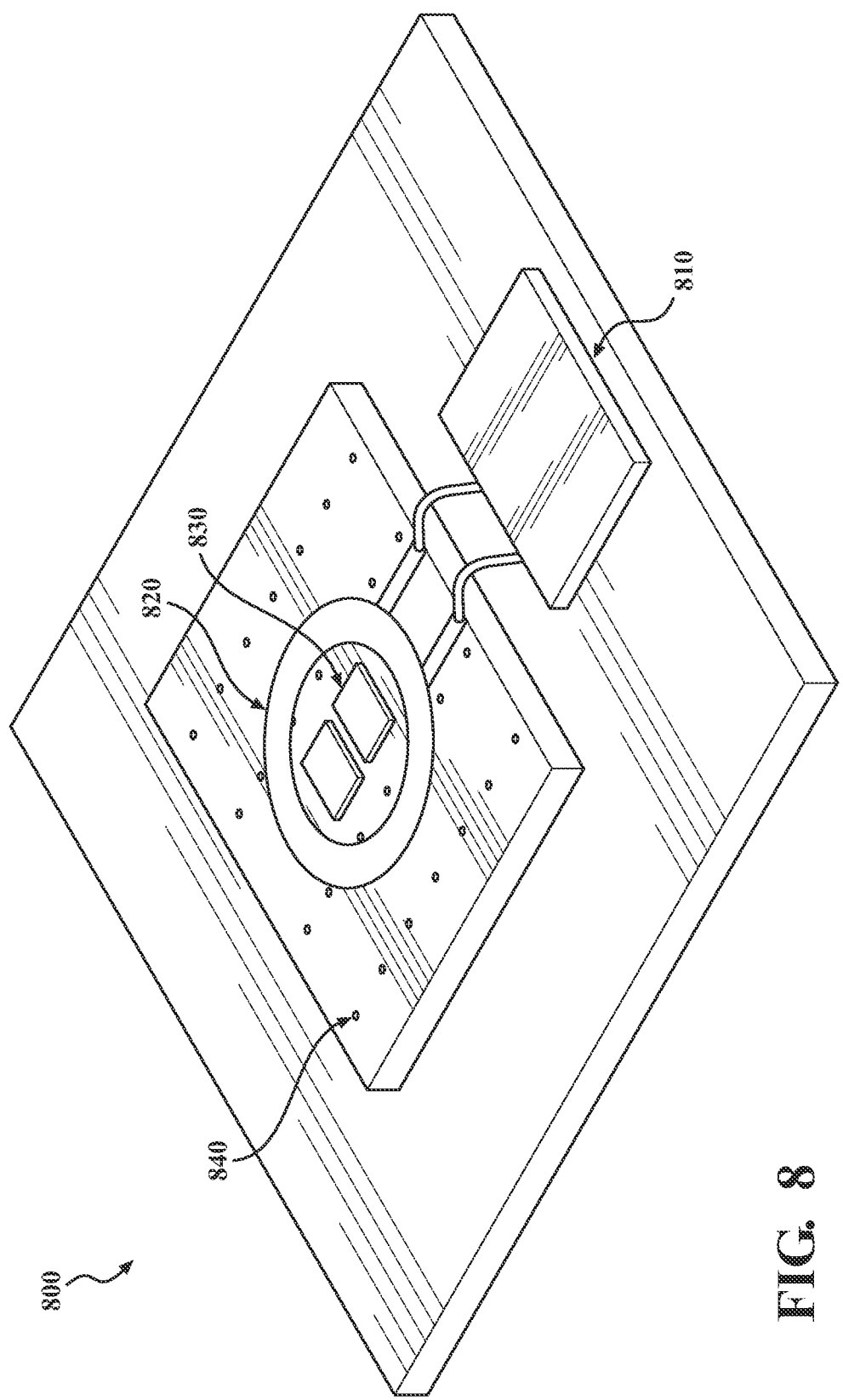
FIG. 8 illustrates an example of a semiconductor integrated circuit incorporating permanent magnets as part of an integrated device for ODMR.
Figure 9:
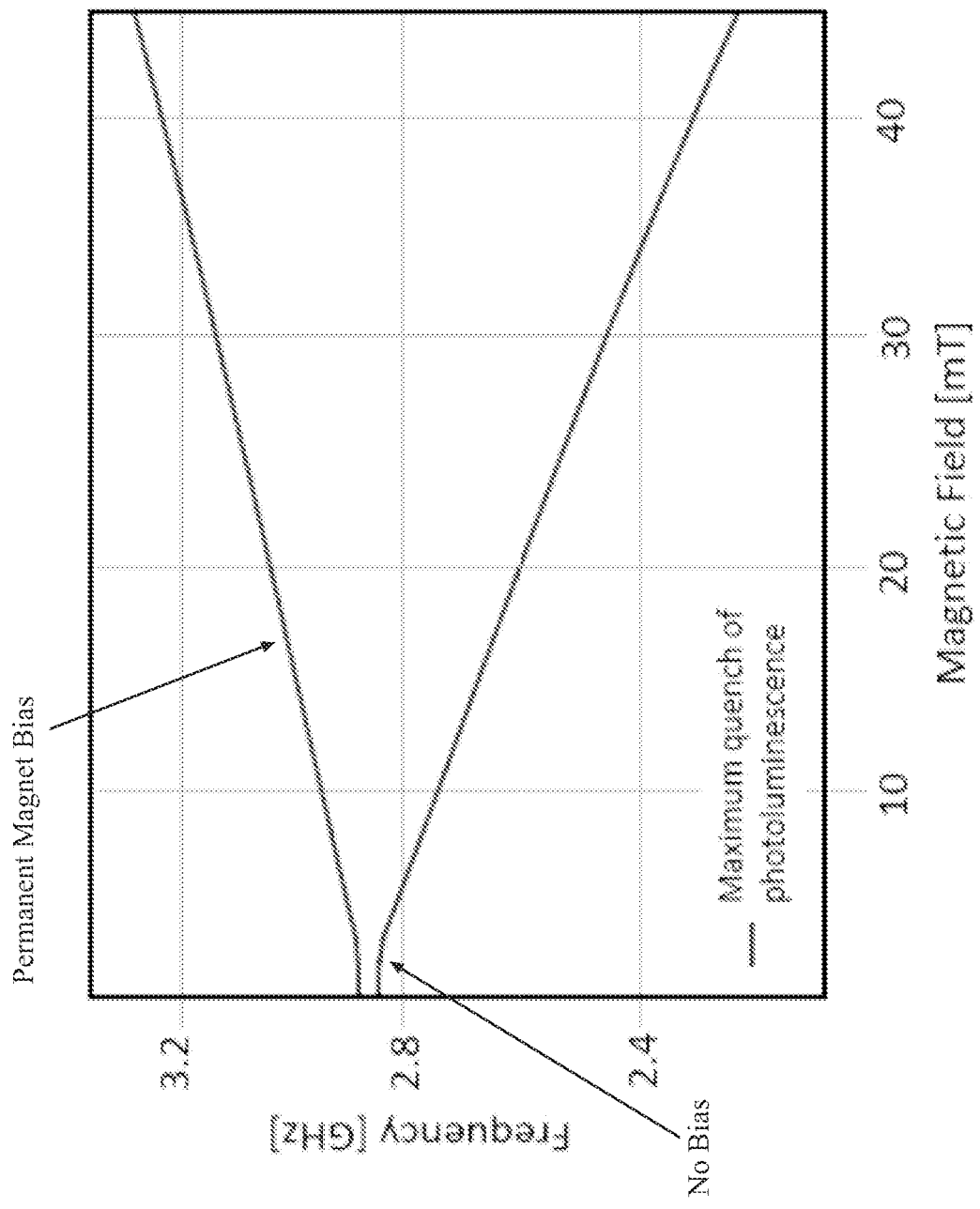
FIG. 9 illustrates an example of how permanent magnets may be used to bias ODMR measurements.

With respect to FIG. 8, an example of a semiconductor integrated circuit 800, which may be used to implement semiconductor integrated circuit 230, is shown that further incorporates permanent magnets 840 in addition to a Micro Generator/PLL 810, microwave antenna 820, and photodetectors 830. As shown in FIG. 9, measurements of a magnetic field at low magnetic strengths may have small response gradients and thus it may be difficult to accurately assess small changes in such a magnetic field. Accordingly, in some embodiments permanent magnets may be used to exert a static magnetic field across NV material 240. In some embodiments, an electromagnetic coil (not shown) may be further integrated into semiconductor integrated circuit 230 as a magnetic field source. In such an embodiment, the electromagnetic coil may be formed using standard multi-layer trace technology in combination with electrical vias. In either embodiment, a static magnetic field generated by permanent magnets or an electromagnetic coil may provide a magnetic bias allowing for small changes in magnetic fields at a low strength to be measured within an area of larger gradient of the ODMR response curves. In some embodiments, permanent magnets or the electromagnetic coil may be implemented in carrier PCB 210 to provide the magnetic bias as described herein.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-9, but the embodiments are not limited to the illustrated structure or application.

Herein, designations such as "first" or "second" are arbitrary and do not signify priority or importance. Rather, they are used to refer to particular elements among a plurality of elements of the same type (e.g., a set of waveguides, a set of temperatures, a set of refractive indexes, etc.).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g. AB, AC, BC or ABC).

As used herein, "cause" or "causing" means to make, command, instruct, and/or enable an event or action to occur or at least be in a state where such event or action may occur, either in a direct or indirect manner.

Aspects herein can be embodied in other forms without departing from the spirit or essential attributes thereof. Accordingly, reference should be made to the following claims rather than to the foregoing specification, as indicating the scope hereof.

What is claimed is:

1. An apparatus comprising:
   a semiconductor integrated circuit comprising a plurality of metal layers;
   a solid-state host disposed on the semiconductor integrated circuit and comprising a plurality of color centers;
   a photonic integrated circuit disposed on the solid-state host and comprising optical modulators and a grating array in optical communication with the plurality of color centers via a material capable of transmitting light below 1000 nm;
   a microwave antenna formed in a first metal layer in the plurality of metal layers of the semiconductor integrated circuit; and
   a photodetector in optical communication with the plurality of color centers.

2. The apparatus of claim 1, wherein the material capable of transmitting light below 1000 nm is silicon nitride or silicon carbide.

3. The apparatus of claim 2, further comprising a plurality of permanent magnets in a second metal layer in the plurality of metal layers.

4. The apparatus of claim 3, wherein the optical modulators are Mach Zehnder modulators or ring resonator modulators.

5. The apparatus of claim 3, further comprising an electromagnetic coil in a second metal layer in the plurality of metal layers.

6. The apparatus of claim 3, wherein the photonic integrated circuit is attached to a laser that generates an optical signal.

7. The apparatus of claim 6, wherein the optical modulators in conjunction with the grating array allow adjustment of a distribution of the optical signal across the solid-state host.

8. The apparatus of claim 6, wherein the laser is coupled to the photonic integrated circuit via fiber/ball assisted coupling or direct edge coupling.

9. The apparatus of claim 6, wherein the laser is attached via laser-to-chip integration.

10. A device comprising:
    a semiconductor integrated circuit comprising permanent magnets, a microwave antenna, and photodetectors;
    a solid-state host disposed on the semiconductor integrated circuit and comprising a plurality of color centers;
    a photonic integrated circuit disposed on the solid-state host and comprising optical modulators and a grating array in optical communication with the plurality of color centers via a material suitable for transmission of light below 1000 nm; and
    a laser attached to the photonic integrated circuit to generate an optical signal.

11. The device of claim 10, wherein the material capable of transmitting light below 1000 nm is silicon nitride or silicon carbide.

12. The device of claim 11, wherein the optical modulators are Mach Zehnder modulators.

13. The device of claim 11, wherein the optical modulators are ring resonator modulators.

14. The device of claim 11, wherein the optical modulators in conjunction with the grating array allow adjustment of a distribution of the optical signal across the solid-state host.

15. The device of claim 11, wherein the laser is coupled to the photonic integrated circuit via fiber/ball assisted coupling or direct edge coupling.

16. An apparatus comprising:
- a solid-state host comprising a plurality of color centers;
- a photonic integrated circuit disposed on the solid-state host and providing an integrated optical path from a laser to the solid-state host via waveguides, optical modulators, and gratings in a material suitable for transmission of light below 1000 nm; and
- a semiconductor integrated circuit disposed on an opposing side of the solid-state host relative to the photonic integrated circuit and containing a microwave antenna and photodetectors optically coupled to the solid-state host.

17. The apparatus of claim 16, wherein the material capable of transmitting light below 1000 nm is silicon nitride or silicon carbide.

18. The apparatus of claim 17, wherein the apparatus further includes an optical filter between the semiconductor integrated circuit and the solid-state host.

19. The apparatus of claim 18, wherein the apparatus further includes a mirror disposed on the photonic integrated circuit on an opposing side of the photonic integrated circuit relative to the solid-state host.

20. The apparatus of claim 17, wherein the semiconductor integrated circuit further includes permanent magnets.

* * * * *